United States Patent
Asano et al.

(10) Patent No.: US 6,833,616 B2
(45) Date of Patent: Dec. 21, 2004

(54) MULTILAYER WIRING BOARD WITH MOUNTING PAD

(75) Inventors: Tetsuro Asano, Oizumi-machi (JP); Mikito Sakakibara, Menuma-machi (JP); Hideyuki Inotsume, Oizumi-machi (JP); Haruhiko Sakai, Ota (JP); Shigeo Kimura, Nitta-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/310,139

(22) Filed: Dec. 5, 2002

(65) Prior Publication Data

US 2003/0151137 A1 Aug. 14, 2003

(30) Foreign Application Priority Data

Dec. 6, 2001 (JP) ........................................ 2001-372313

(51) Int. Cl.⁷ ................................................. H05K 1/11
(52) U.S. Cl. ........................ 257/700; 174/250; 257/758; 361/767; 361/772
(58) Field of Search ................................. 257/690–700, 257/728, 750–766; 174/250–268; 361/760–783

(56) References Cited

U.S. PATENT DOCUMENTS

| | | | | |
|---|---|---|---|---|
| 4,404,059 A | * | 9/1983 | Livshits et al. | 216/17 |
| 5,252,519 A | * | 10/1993 | Nakatani et al. | 29/832 |
| 5,818,699 A | * | 10/1998 | Fukuoka | 361/760 |
| 5,841,190 A | * | 11/1998 | Noda et al. | 257/678 |

* cited by examiner

Primary Examiner—Wael Fahmy
Assistant Examiner—Marcos D. Pizarro-Crespo
(74) Attorney, Agent, or Firm—Morrison & Foerster LLP

(57) ABSTRACT

A semiconductor chip is mounted on a wiring board that has a two-layer lead structure. One of the leads used for receiving input signals is disposed on the lower layer and runs underneath the semiconductor chip forming an U-shaped wiring line while other leads are disposed on the upper layer. Because one of the upper layer leads for receiving input signals is disposed in the U-shaped pocket of the U-shaped wiring line of the lower layer, the relative positioning of corresponding terminals can be changed into a reversal of the positioning of the electrode pads of the chip connected to the terminals. Furthermore, one of the upper layer lead for receiving control signals is placed between the chip and the lower layer lead underneath the chip to prevent high frequency signal interference.

17 Claims, 13 Drawing Sheets

Prior Art

MULTILAYER WIRING BOARD WITH MOUNTING PAD

BACKGROUND OF THE INVENTION

1. Field of the Invention

This invention relates to a semiconductor device and its packaging, specifically to a packaging of semiconductor device that accommodates variable requirements of a user of the semiconductor device while maintaining good high frequency characteristics.

2. Description of the Related Art

Switching elements for high frequency signals have been a focus of development in many application areas including mobile communication equipment that utilizes microwaves in GHz frequency range and alternates antennas and receiving/transmitting signals. Such a device is described, for example, in Japanese Laid Open Patent Publication No. Hei 9-181642. This type of device often includes a field effect transistor (FET) functioning as a high frequency switch, which is made of a gallium arsenide (GaAs) material, and is integrated as a monolithic microwave integrated circuit (MMIC) having the high frequency switches.

An MMIC device with two GaAs switches, as a result of the most recent development is described in a commonly owned copending U.S. patent application Ser. No. 10/016,143, entitled "Compound Semiconductor Switching Device." The disclosure of U.S. patent application Ser. No. 10/016,143 is, in its entirety, incorporated herein by reference. FIG. 1 is a plan view of a packaging structure of the device described in this U.S. Patent application. A chip 119 has two GaAs FET switches (not shown). One of the two switches has two input electrode pads 235a, 235b, an output electrode pad 235g and a control electrode pad 235h, another of the two switches has two input electrode pads 235c, 235d, an output electrode pad 235f and a control electrode pad 235e. Each of the control electrode pads 235e, 235h is shared by the two switches. Each of the eight electrode pads is connected to a corresponding terminal 135a–135h, which is disposed adjacent the electrode pad on an insulating substrate 122, by a bonding wire 137. The chip 119 is mounted on a base 125 that is a part of a lead pattern 127 including the terminals 135a–135h.

One of the applications of this two-switch device is to alternate two pairs of complementary signals. For example, a mobile telephone needs to alternate between a CDMA (Code Division Multiple Access) signal and a GPS (Global Positioning System) signal. The connection scheme of this application is shown in FIG. 2. One of a pair of CDMA balanced signals is applied to the input electrode Ia1, and another to the input electrode Ib1. One of a pair of GPS balanced signals is applied to the input electrode Ia2, and another is to Ib2. In this configuration, depending on a control signal applied to each of the control electrode pads C1, C2 of the two switches, the balanced CDMA signal or the balanced GPS signal is selected and outputted to the two output electrode pads Oa, Ob.

However, a user of this two-switch device has to provide a wiring configuration that allows an intersection of one of the CDMA balanced signals and one of the GPS balanced signals. Since these are signals in an RF (Radio Frequency) range, such an intersecting wiring needs to be carefully designed to avoid mutual interference by the user and requires additional space to accommodate the intersection.

SUMMARY OF THE INVENTION

The invention provides a wiring board for mounting a surface mounted element. The wiring board includes an insulating substrate, a first terminal disposed on the substrate, a first lead disposed on the substrate and extending from the first terminal, and an insulating layer disposed on the first terminal, the first lead and the substrate. The wiring board further includes a second terminal disposed on the insulating layer, a second lead disposed on the insulating layer and extending from the second terminal, a third terminal disposed on the insulating layer, and a third lead disposed on the insulating layer and extending from the third terminal. A portion of the third lead is configured to have the surface mounted element mounted thereon. The wiring board also includes a fourth lead disposed on the insulating layer. The first terminal and the fourth lead are disposed opposite to each other with respect to the second lead. In this configuration, the first and second terminals are disposed on the same side of the wiring board with respect to the mounting portion of the third lead. The first lead runs underneath the mounting portion of the third lead and is connected to the fourth lead.

The invention also provides a packaging of a surface mounted element, which includes an insulating substrate, a first terminal disposed on the substrate, a first lead disposed on the substrate and extending from the first terminal, and an insulating layer disposed on the first terminal, the first lead and the substrate. The packaging further includes a second terminal disposed on the insulating layer, a second lead disposed on the insulating layer and extending from the second terminal, a third terminal disposed on the insulating layer, and a third lead disposed on the insulating layer and extending from the third terminal. The surface mounted element is mounted on a portion of the third lead. The packaging also includes a fourth lead disposed on the insulating layer. The first terminal and the fourth lead are disposed opposite to each other with respect to the second lead. In this configuration, the first and second terminals are disposed on the same side of the substrate with respect to the surface mounted element. The first lead runs underneath the mounting portion of the third lead and is connected to the fourth lead.

The invention further provides a semiconductor device, which includes an insulating substrate, a first terminal disposed on the substrate, a first lead disposed on the substrate and extending from the first terminal, and an insulating layer disposed on the first terminal, the first lead and the substrate. The semiconductor device also includes a second terminal disposed on the insulating layer, a second lead disposed on the insulating layer and extending from the second terminal, a third terminal disposed on the insulating layer, and a third lead disposed on the insulating layer and extending from the third terminal. The semiconductor device further includes a semiconductor chip mounted on a portion of the third lead and having a plurality of electrode pads formed on a surface thereof, and a fourth lead disposed on the insulating layer. The first terminal and the fourth lead are disposed opposite to each other with respect to the second lead. In this configuration, the first and second terminals are disposed on the same side of the substrate with respect to the semiconductor chip. The first lead runs underneath the mounting portion of the third lead and is connected to the fourth lead.

DETAILED DESCRIPTION OF THE INVENTION

Figure 3:
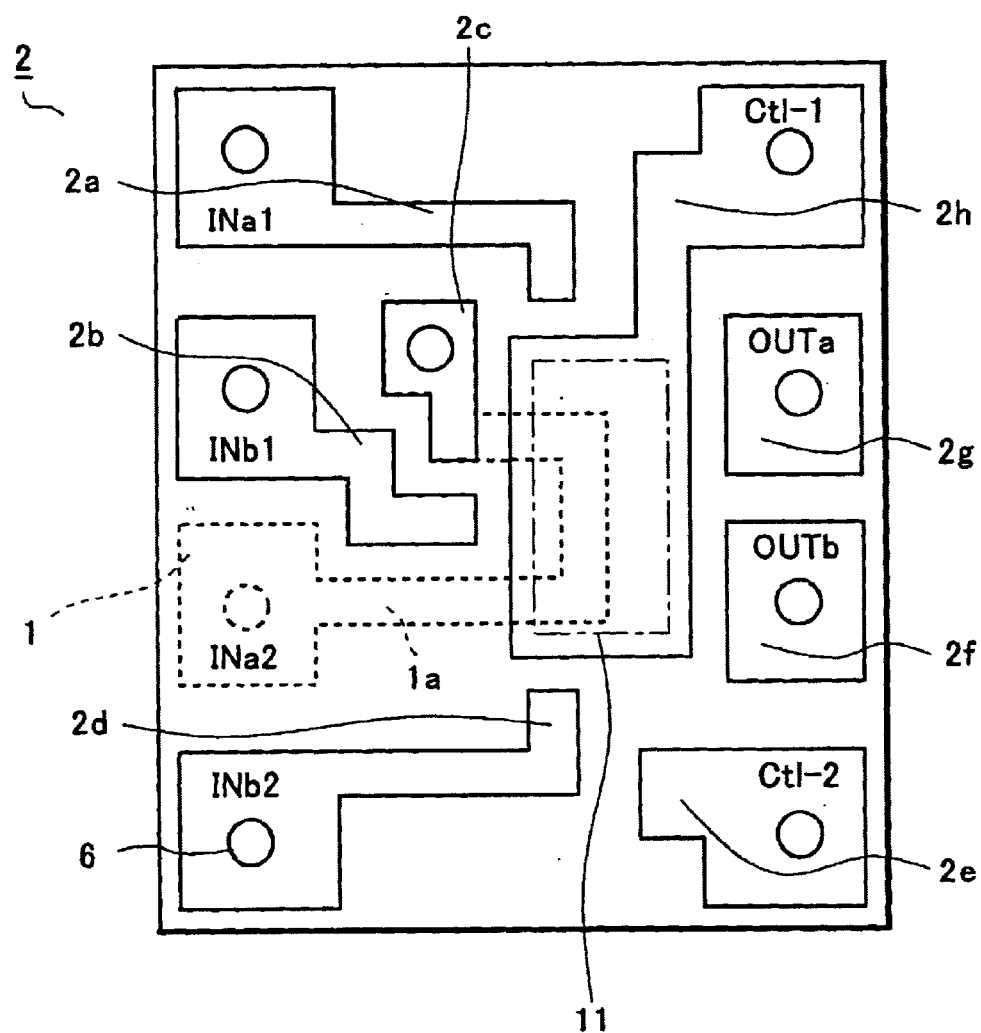
FIG. 3 is a plan view of a wiring board with four input terminals of a first embodiment of this invention.
Figure 4A:
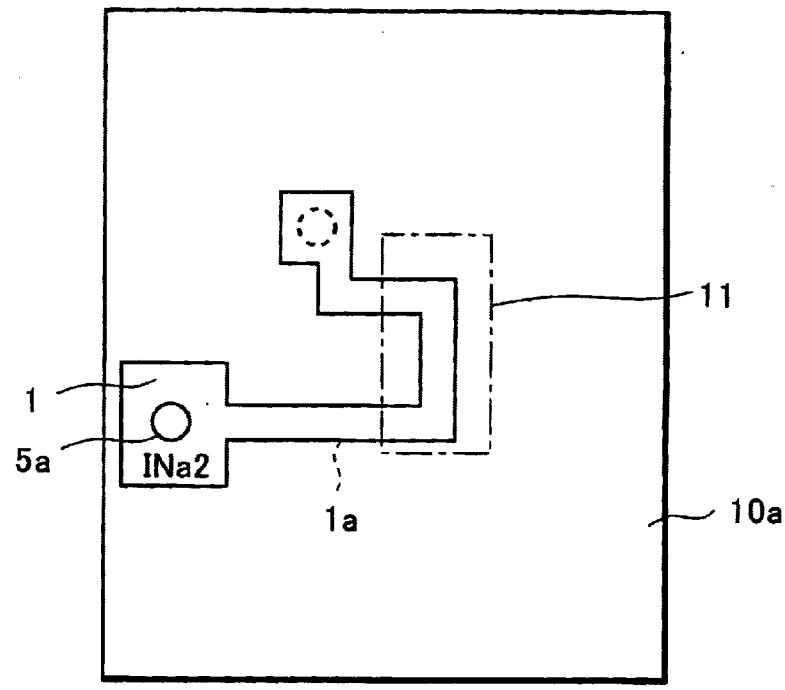
FIG. 4A is a plan view of a top surface of an insulating substrate of the wiring board of FIG. 3 having a lead pattern including a terminal and a lead.
Figure 4B:
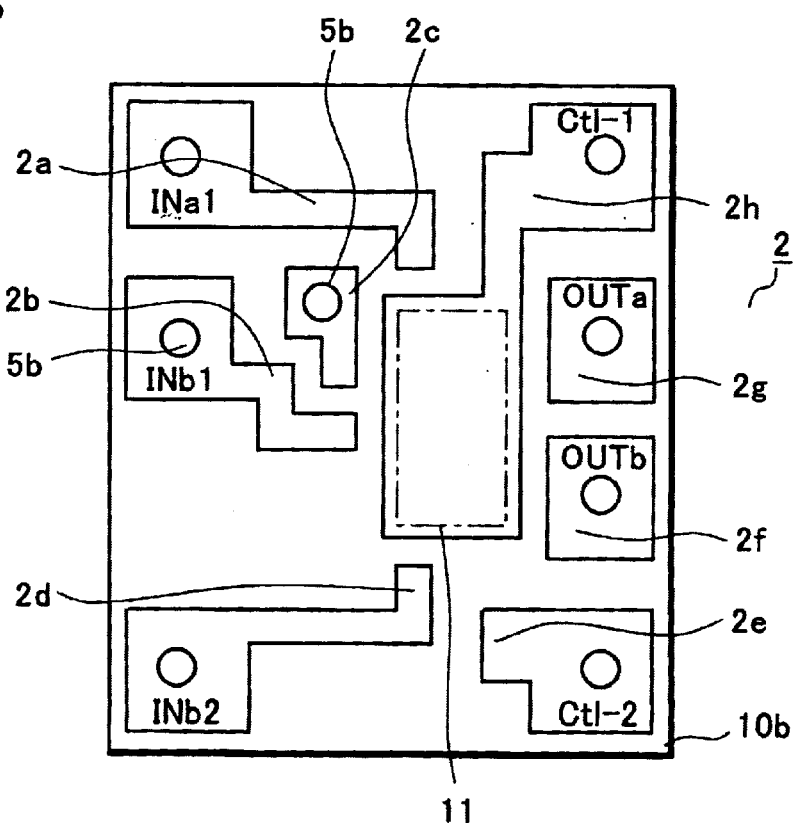
FIG. 4B is a plan view of an insulating layer formed on the insulating substrate and having a lead pattern including a plurality of terminals and a plurality of leads.

A semiconductor device with a packaging structure of a first embodiment of this invention is described with reference to FIGS. 3–9B. FIG. 3 is a plan view of a wiring board of the first embodiment, which is made of an insulating substrate 10a shown in FIG. 4A and an insulating layer 10b formed on the insulating substrate shown in FIG. 4B. The insulating substrate 10a has a first layer lead pattern 1 on its surface, and the insulating layer 10b has a second layer lead pattern 2 on its surface. In FIG. 3, the first layer lead pattern 1 is indicated by the dotted line. The insulating substrate 10a is made of ceramics, glass epoxies or the like, and the first layer lead pattern 1 is formed by gold plating on the insulating substrate 10a. The insulating layer 10b covers the first layer lead pattern 1 and the insulating substrate 10a, and the second layer lead pattern 2 is formed by gold plating on the insulating layer 10b. The size of the insulating layer 10b are the same as those of the insulating substrate 10a, and the layer and the substrate substantially overlap with each other.

The lead pattern 1 has an input terminal INa2 and a lead 1a extending from the input terminal INa2. The input terminal INa2 feeds a signal to one of two FET switches of a compound semiconductor chip that is mounted on the wiring board at a mounting area 11 of the lead pattern 2. A terminal is an area of the lead pattern that is used for an external connection, and a lead is a portion of the lead pattern that is used for connection with an electrode pad of the semiconductor chip.

The lead 1a is bent in a plane of the substrate 10a so that the lead 1a runs underneath the mounting area 11. In this embodiment, the lead 1a comes in the area of the substrate 10a covered by the mounting area 11 and comes out of the area on the same side of the element mounting area 11. The end portion of the lead 1a and its terminal INa2 are disposed opposite to each other with respect to a lead 2b of the second layer lead pattern 2 (FIG. 3). The end portion of the lead 1a is connected to a lead 2c of the second layer lead pattern 2 through a through hole 5b formed in the insulating layer 10b. The lead 2c substantially overlaps with the end portion of the lead 1a, as shown in FIG. 3. The input terminal INa2 is connected to an external electrode (not shown) that is formed on a bottom side of the insulating substrate 10a through a through hole 5a formed in the insulating substrate 10a, as later described with reference to FIGS. 9A and 9B. As long as the end portion of lead 1a is exposed outside the mounting area 11 and has enough space for forming the through hole 5b, the relative positioning of the lead 1a and the mounting area 11 with respect to the substrate 10a is not limited to the configuration of FIG. 4A. If necessary, this end portion further extends to come back in the area covered by the mounting area 11, provided that the lead 1a is exposed enough for through hole formation besides the portion of the lead 1a that extends from the input terminal INa2.

The lead pattern 2 on the insulating layer 10b has three inputs terminals INa1 INb1, INb2, two control terminals Ctl-1, Ctl-2 and two output terminals OUTa, OUTb for the two FET switches of the two-switch compound semiconductor device. All three input terminals have corresponding leads 2a, 2b, 2d extending from the respective terminals. In this lead pattern 2, the terminals are connected to external signal transmitting/receiving device via external electrodes that are formed underneath the terminals on the bottom side of the substrate. The three input terminals INa1, INb1, INb2 of the second layer lead pattern 2 as well as the input terminals INa2 of the first layer lead pattern 1 are located on the same side of the wiring board with respect to the mounting area 11. Other terminals of the second layer lead pattern 2 are located on the opposite side of the wiring board with respect to the mounting area 11. All the terminals of the second layer lead pattern 2 are connected to corresponding external electrodes formed on the bottom side of the insulating substrate through the through hole 5b of the insulating layer 10b and the through hole 5a of the insulating substrate 10a.

The mounting area 11 is a portion of the lead 2h extending from the control terminal Ctl-1, which receives a DC voltage as a control signal. This lead 2h functions as an electromagnetic shield to prevent high frequency signal interference between the lead 1a located under the chip and the circuit elements formed on the chip. When the signal frequency is in the IF (Intermediate Frequency) band, for example 100 MHz, the chip may be directly mounted on one of the lead formed on the top surface of the wiring board and may be free from signal interference problems. Such a device design is described in a commonly owned copending U.S. patent application Ser. No. 10/283,365, entitled "SEMICONDUCTOR DEVICE," the disclosure of which is, in its entirety, incorporated herein by reference. However, when the signal frequency is above the IF band, for example 5 GHz, the device needs the electromagnetic shield to prevent high frequency signal interference, that results in reduced isolation characteristics of the device.

Figure 5A:
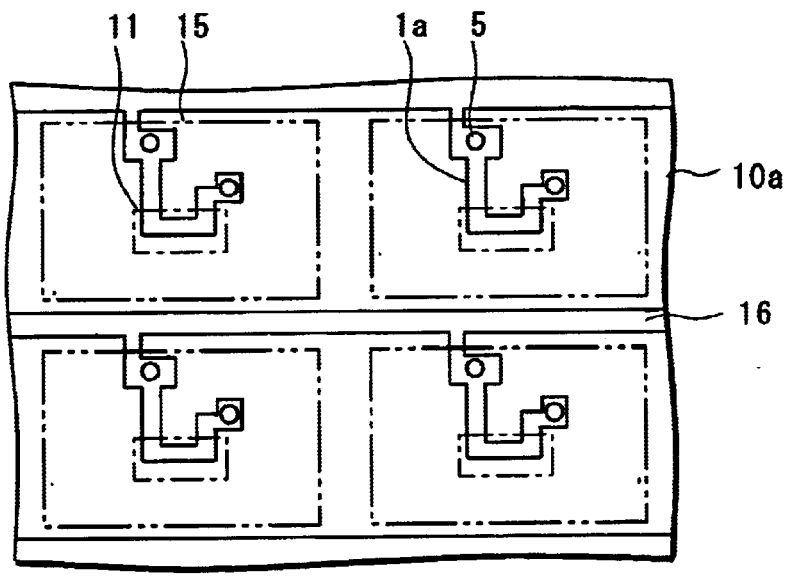
FIG. 5A is a plan view of the lead pattern on the insulating substrate surface for a plurality of chips.
Figure 5B:
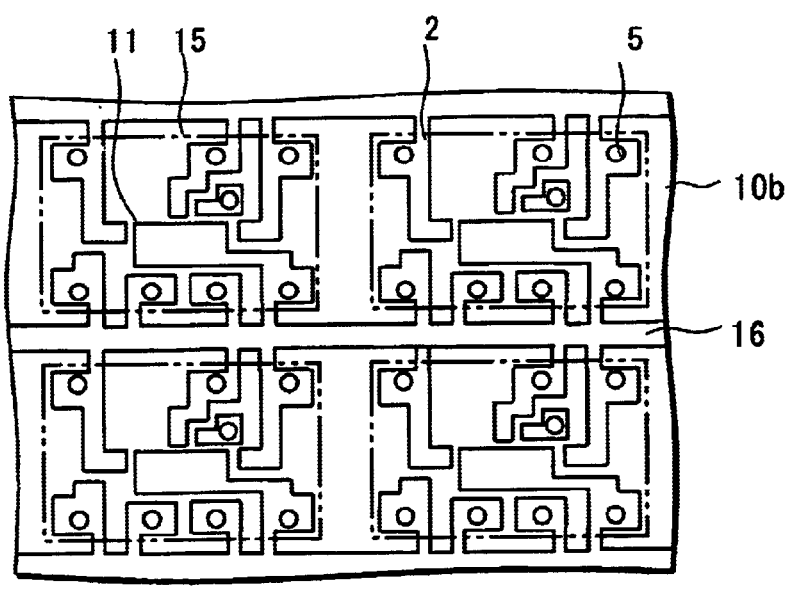
FIG. 5B is a plan view of the lead pattern on the insulating layer for a plurality of chips.

FIG. 5A is a plan view of the first layer lead pattern 1 for a plurality of the compound semiconductor chips, and FIG. 5B is a plan view of the second layer lead pattern 2 for a plurality of the compound semiconductor chips. Each of package areas 15 of the lead patterns 1, 2 contains the same lead patterns as those of FIGS. 4A and 4B. In both lead patterns 1, 2, the package areas 15 are interconnected by a connecting portion 16. In this embodiment, the package area 15 is about 1.9 mm×1.6 mm, and the mounting area 11 is about 0.62 mm×0.31 mm, although the size of the mounting area 11 should be adjusted according to the size of a chip mounted thereon. The separation between the package areas 15 are about 100 μm in the both longitudinal and the transverse directions. This separation is required for dicing the wiring board into separate individual completed packages. The connecting portion 16 is required to form the lead pattern 2 using gold plating. When electroless plating is used for forming the lead patterns 1, 2, the connecting portion 16 is not required and the package areas 15 are formed to be separated from each other.

Figure 6:
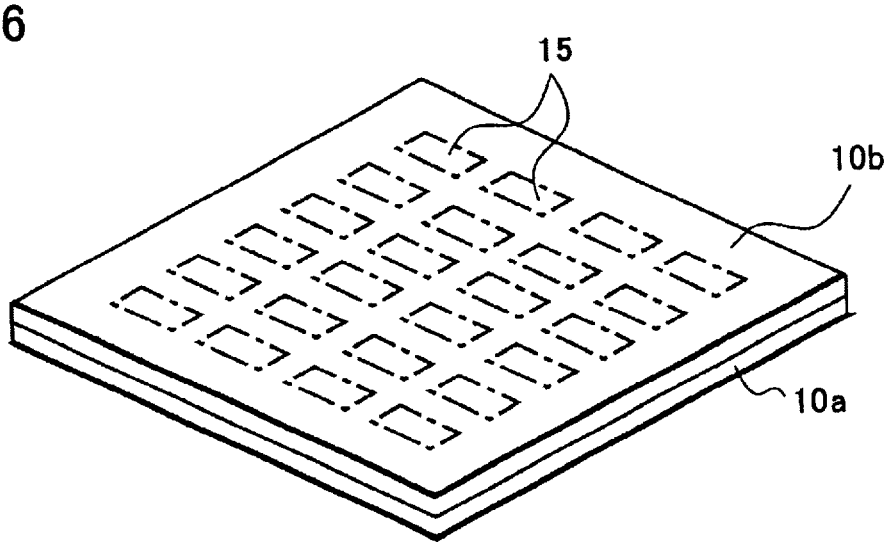
FIG. 6 is a perspective view of the wiring board of the first embodiment.

FIG. 6 is a perspective view of the wiring board used in the first embodiment. The wiring board prior to dicing step is large enough to provide more than one hundred package areas 15. In this embodiment, the insulating layer 10b covering the insulating substrate 10a is made of a ceramic, a glass epoxy or the like. The total thickness of the wiring board is 180 to 250 μm so that the wiring board can withstand mechanical stresses it receives during manufacturing processes and can accommodate a multi-layer wiring structure.

Figure 7:
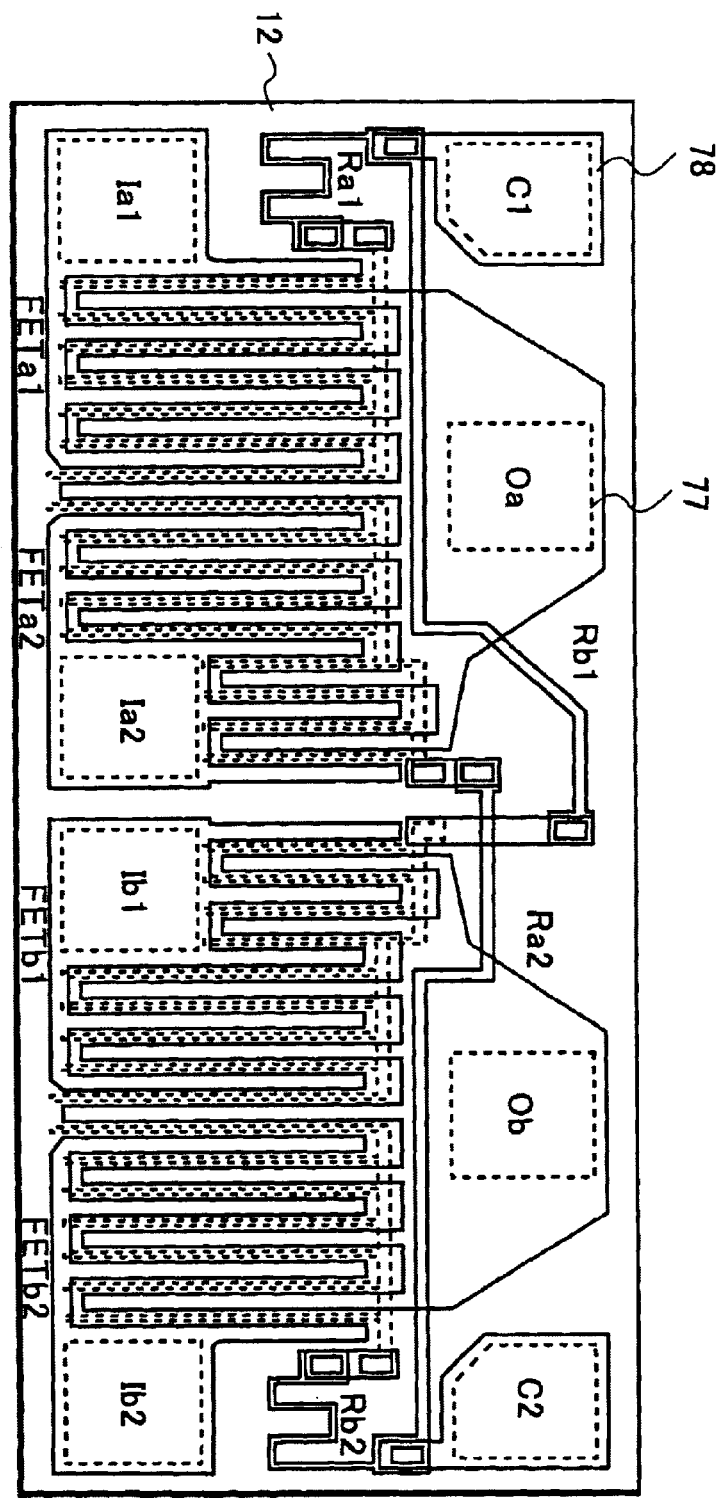
FIG. 7 is a plan view of a compound semiconductor chip having two FET switches of the first embodiment.

FIG. 7 is a plan view of the two-switch compound semiconductor chip used in the first embodiment. Two FET switches are formed on a GaAs substrate 12. The one on the top includes a pair of FETs, FETa1 and FETa2, and the one on the bottom includes another pair of FETs, FETb1 and FETb2. Each of the switches has two input electrode pads, Ia1 and Ia2 for the top switch, Ib1 and Ib2 for the bottom switch, an output electrode pad, Oa for the top switch and Ob for the bottom switch, and a control electrode pad, C1 for the top switch and C2 for the bottom switch. Each of the control electrode pads C1, C2 is shared by the two switches. Resistors Ra1, Rb1 Ra2, Rb2 are formed between corresponding gates of the FETs and the corresponding control electrode pads C1, C2 to prevent leakage of high frequency signals from the gate of the FETs. The incorporated copending U.S. patent application Ser. No. 10/016,143 describes the operation of this semiconductor device more in details.

Figure 8A:
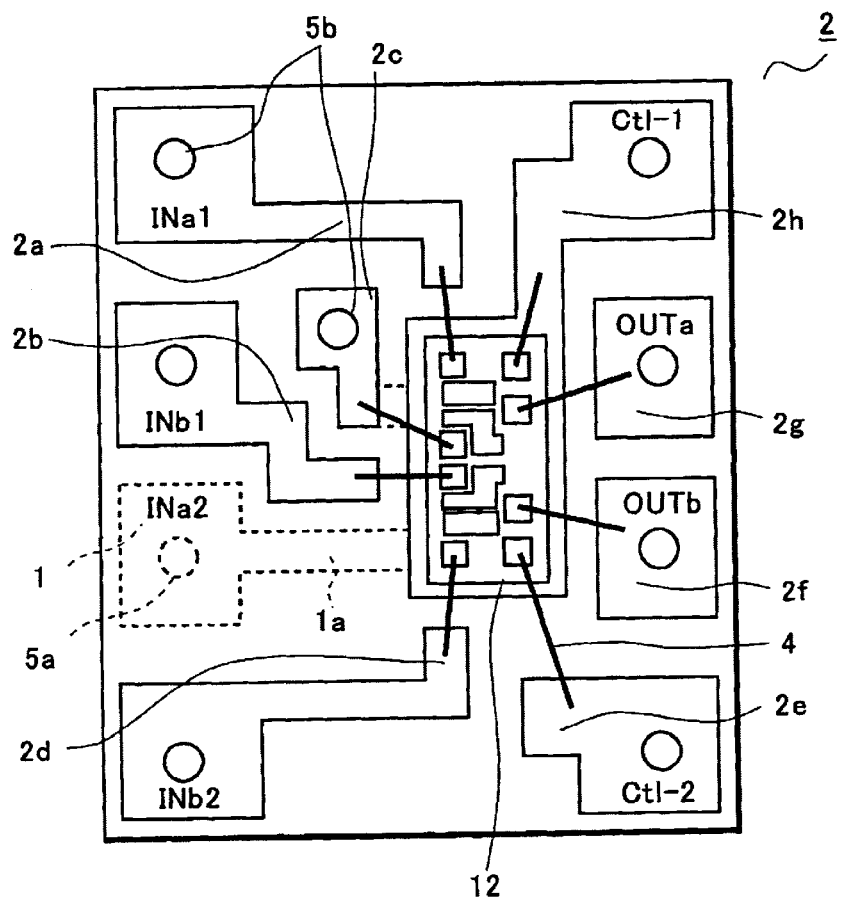
FIG. 8A is a plan view of the semiconductor chip of FIG. 7 mounted on the wiring board of FIG. 3.

FIG. 8A is a plan view of a packaging structure of the first embodiment in which the compound semiconductor chip 12 of FIG. 7 is mounted on the wiring board of FIG. 3. The orientation of the chip 12 is the same as that of FIG. 7, i.e., the four input terminals are on the left side of the wiring board and the output and control terminals are on the right side of the wiring board. The chip is mounted on the lead 2h at the mounting area 11 of the lead pattern 2. The lead 1a of the first layer lead pattern 1 extends from the input terminal INa2 runs underneath the chip. The lead 1a comes in and comes out of the area of the substrate 10a covered by the chip 12 on the same side of the chip 12. The lead 2c of the second layer lead pattern 2 and its terminal INa2 of the first layer lead pattern 1 are disposed opposite to each other with respect to the lead 2b of the second layer lead pattern 2. In this embodiment, the whole bottom side of the chip 12 is covered by the lead 2h. However, the lead 2h does not have to cover the whole bottom side of the chip as long as it functions as a proper electromagnetic shield between the lead 1a underneath the chip and the circuit elements of the chip. For example, the lead 2h may cover the bottom side of the chip only at portions corresponding to the lead 1a running under the chip, and may still be effective in preventing the high frequency signal interference.

Figure 2:
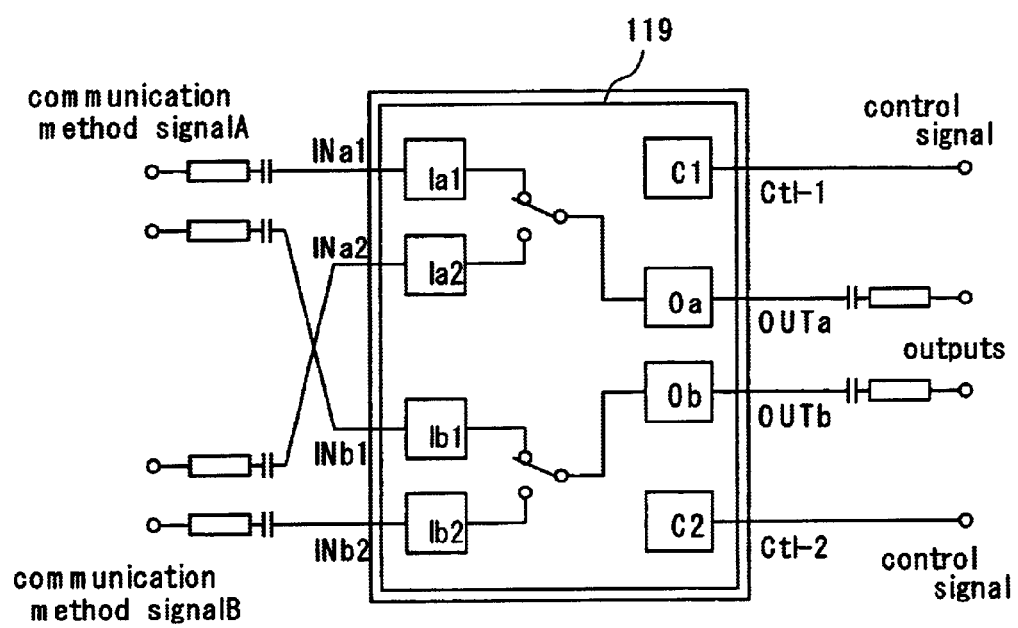
FIG. 2 is a schematic circuit diagram showing a connection of four input terminals of the two-switch chip to an external signal source.
Figure 8B:
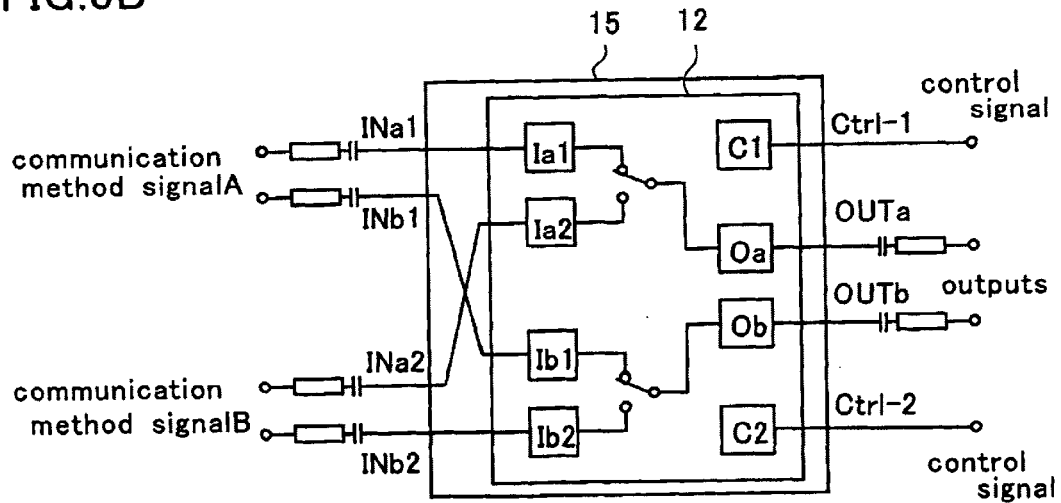
FIG. 8B is a schematic circuit diagram showing a connection of the four input terminals of the two-switch chip of FIG. 7 to an external signal source.

The leads are connected to the corresponding electrode pads on the chip by bonding wires 4 using ball bonding or ultrasonic wave wedge bonding. On the right side of the wiring board, the leads 2g, 2f extending from the output terminals OUTa, OUTb are connected to the output electrode pads Oa, Ob, respectively. The leads 2h, 2e extending from the control terminals Ctl-1, Ctl-2 are connected to the control electrode pads C1, C2, respectively. On the left side of the wiring board, the leads 2a, 2d extending form the input terminals INa1, INb2 are connected to the input electrode pads Ia1, Ib2, respectively. Positioning of these six terminals are the same as the positioning of the six corresponding electrode pads. However, the lead 1a extending from the input terminal INa2 is connected to its corresponding electrode pad Ia2 at its end portion through the lead 2c formed on the insulating layer 10b. The lead 2b extending from the input terminal INb1 is connected to the input electrode pad Ib1. This lead 2b is located between the lead 2c, which is connected to the lead 1a of the first layer lead pattern 1, and the portion of the lead 1a extending from the input terminal INa2 to the mounting area 11. This configuration provides an intersection of wiring within the packaging, as shown in FIG. 8B. Accordingly, the relative positioning of the two input terminals INb1, INa2 in the middle is a reversal of the relative positioning of the corresponding input electrode pads Ia2, Ib1 on the chip 12. Thus, a user of this device does not have to provide an intersecting wiring outside the packaging such as the one shown in FIG. 2.

In this configuration, the lead 2h having the chip thereon can function as an electromagnetic shield because it receives DC voltages, either 3 volts or zero volt, as control signals. Any DC voltage can serve as a ground voltage with respect to shielding a high frequency signal. Accordingly, the lead 2h disposed between the chip and the underlining high frequency signal wiring (lead 1a) can prevent the high frequency signal interference when the lead 2h receives the control signals of the switching device.

FIG. 8B is a schematic circuit diagram showing a connection of the four input terminals of the two-switch chip 12 of FIG. 8A to external signal sources A, B. One of the balanced signal of signal A needs to be fed to an input terminal of the first switch and another balanced signal of signal A needs to be fed to an input terminal of the second switch. Signal B also needs to be divided to the two switches. Because the order of the alignment of the four input electrode pads on the chip is different from the alignment of the outputs of the corresponding balanced signals, the two signal lines in the middle need to intersect each other in the circuit diagram. This is achieved by the configuration of the lead 1a extending from the input terminal INa2 with respect to the lead 2b extending from the input terminal INb1, as described above. Accordingly, the relative positioning of the input terminals are the same as the relative positioning of the corresponding outputs of the signal sources.

The first layer lead pattern 1 and the second layer lead pattern 2 are formed by a plating process based on thick film printing. Accordingly, the separations between the terminals and between the leads are as small as 75 μm. This contributes to reduction of overall packaging size.

Figure 9A:
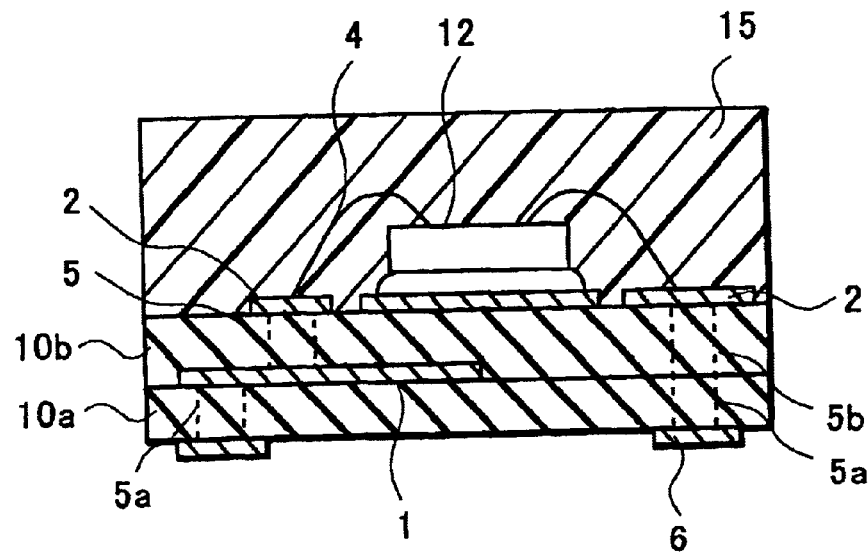
FIG. 9A is a cross-sectional view of the packaging structure of FIG. 8A.

FIG. 9A is a schematic cross-sectional view of the packaging structure of FIG. 8A to show the components of the packaging. The compound semiconductor chip 12 is mounted on the lead 2h of the second layer lead pattern 2 with an insulating adhesive. The electrode pads are connected to the corresponding leads of the second layer lead pattern 2 by the bonding wires 4. Because the end portion of each lead is disposed close to the corresponding electrode pad on the chip 12, the length of each bonding wire 4 is short. The terminals of the second layer lead pattern 2 are connected to the external electrodes 6 that are formed underneath the corresponding terminals on the bottom side of the insulating substrate 10a through the through holes 5a of the insulating substrate 10a and the through holes 5b of the insulating layer 10b. The input terminal INa2 of the first layer lead pattern 1 is connected to the corresponding external electrode 6 through the through hole 5a. The through holes 5a, 5b are filled with a conductive material such as tungsten. The lead 2c, which is connected to the electrode pad Ia2 of the chip 12, is connected to the lead 1a through the through hole 5b, and is electrically connected to the external electrode 6 corresponding to the input terminal INa2 through the lead 1a of the first layer lead pattern 1. A resin layer 15 covers the chip 12, the lead pattern 2 and the insulating layer 10b. The top of the resin layer 15 generally has a flat surface. The thickness of the resin layer 15 is about 0.3 mm. The thickness of the chip 12, which is sealed by the resin layer 15, is about 130 μm.

Figure 9B:
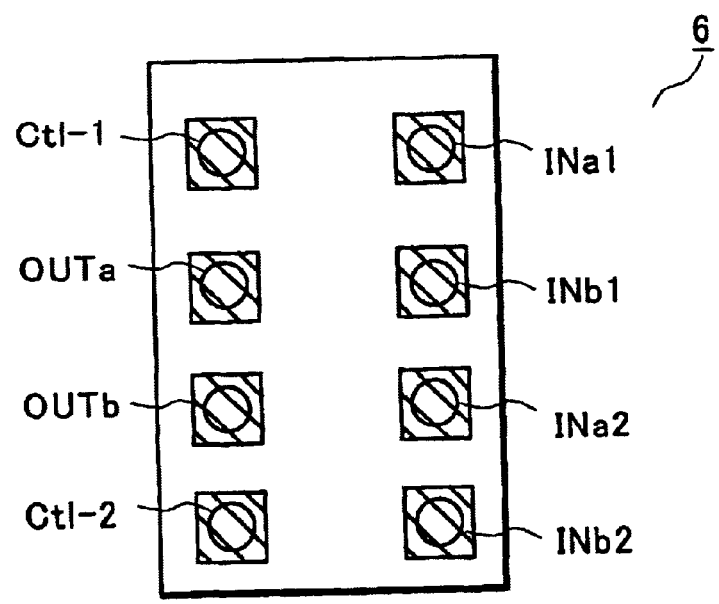
FIG. 9B is a plan view of the bottom side of the packaging structure of FIG. 8A.

FIG. 9B shows the bottom side of the packaging of FIG. 9A. Because the external electrodes 6 are formed just underneath the corresponding terminals, the positioning of the external electrodes on the bottom side of the packaging is exactly the same as the positioning of the terminals on the front side of the packaging including the input terminal of the first layer lead pattern 1. Accordingly, the external electrodes 6, which make directs contact with the corresponding signal lines of the external signal sources, have the same relative positioning as the corresponding outputs of the signal sources. Because of the symmetrical configuration of the external electrodes 6, it may be difficult to identify each external electrode 6. For this reason, an identification marking for each external electrode 6 is formed on the top surface of the resin layer 15 at a corresponding location. Markings may be formed by indenting the top surface or printing the top surface.

Figure 10:
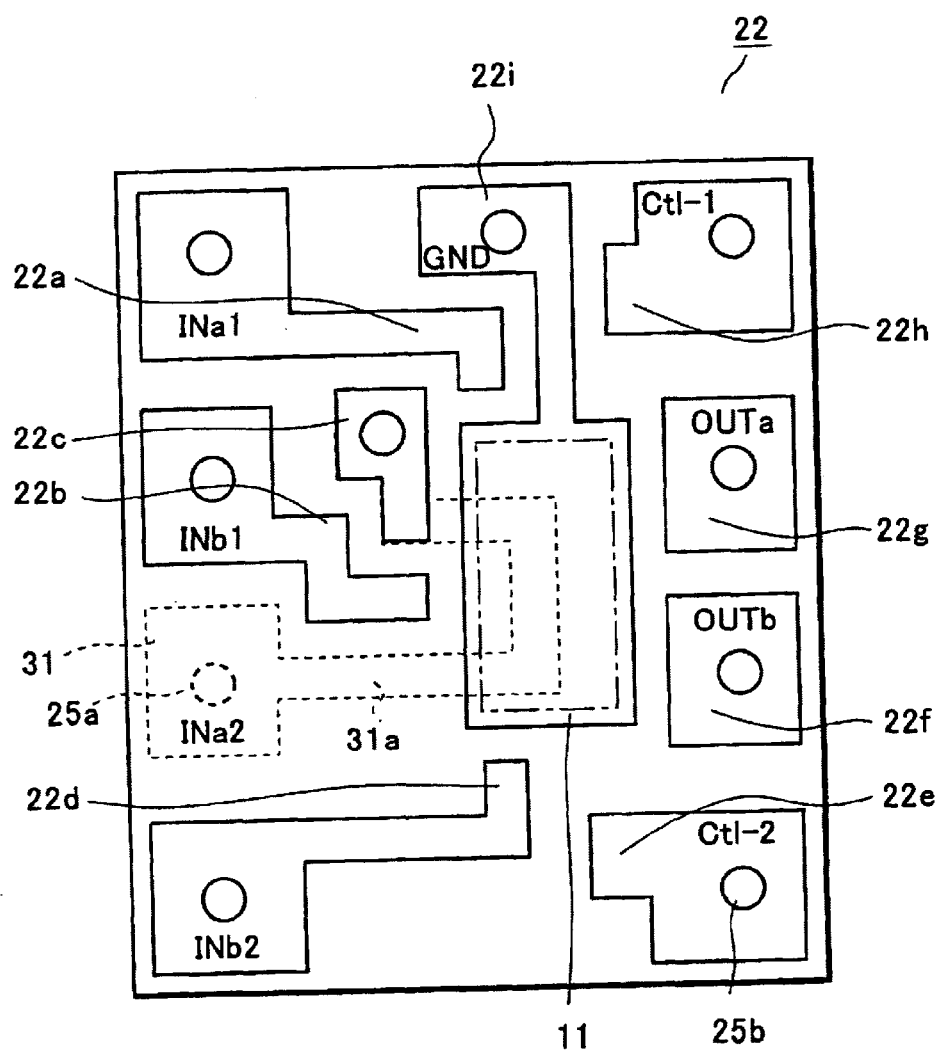
FIG. 10 is a plan view of a wiring board with four input terminals of a second embodiment of this invention.

A semiconductor device with a packaging structure of a second embodiment of this invention is described with reference to FIGS. 10 and 11. FIG. 10 is a plan view of a wiring board of the second embodiment. The first layer lead pattern 31 having an input terminal INa2 and a lead 31a extending from the input terminal INa2 of the second embodiment, which is indicated by the dotted lines in FIG. 10, is substantially the same as the first lead pattern 1 of the first embodiment. As is the case with the first embodiment, the U-shaped lead 31a, which runs underneath the mounting area 11 and has the far end of a neighboring lead 22b in its U-shaped pocket, provides an intersecting wiring within the packaging.

The second layer lead pattern 22 of the second embodiment is substantially the same as the second layer lead pattern 2 of the first embodiment except that a lead 22h extending from the control terminal Ctl-1 does not extend to the mounting area 11, and that a lead 22i extending from a ground terminal GND is provided to cover the mounting area 11. Other terminals INa1, INb1, INb2, OUTa, OUTb, Ctl-2 and the corresponding leads 22a, 22b, 22d, 22e, 22f, 22g including a lead 22c connected to the lead 31a of the first layer lead pattern 31 are disposed in the same manner as the first embodiment. All the terminals of the second layer lead pattern 22 are connected to external electrodes (not shown) formed underneath the corresponding terminals on the bottom side of the insulating substrate through corresponding through holes 25a formed in the insulating substrate and through holes 25b formed in the insulating layer.

The cross-sectional structure of the packaging of the second embodiment is substantially the same as the structure of the first embodiment shown in FIG. 9A. The lead 22c of the second layer lead pattern 22 is connected to the lead 31a of the first layer lead pattern 31 through the through hole 25b, and the terminal INa2 corresponding to the lead 31a is connected to the external electrode through the through hole 25a, which is formed away from the corresponding through hole 25b.

Figure 11:
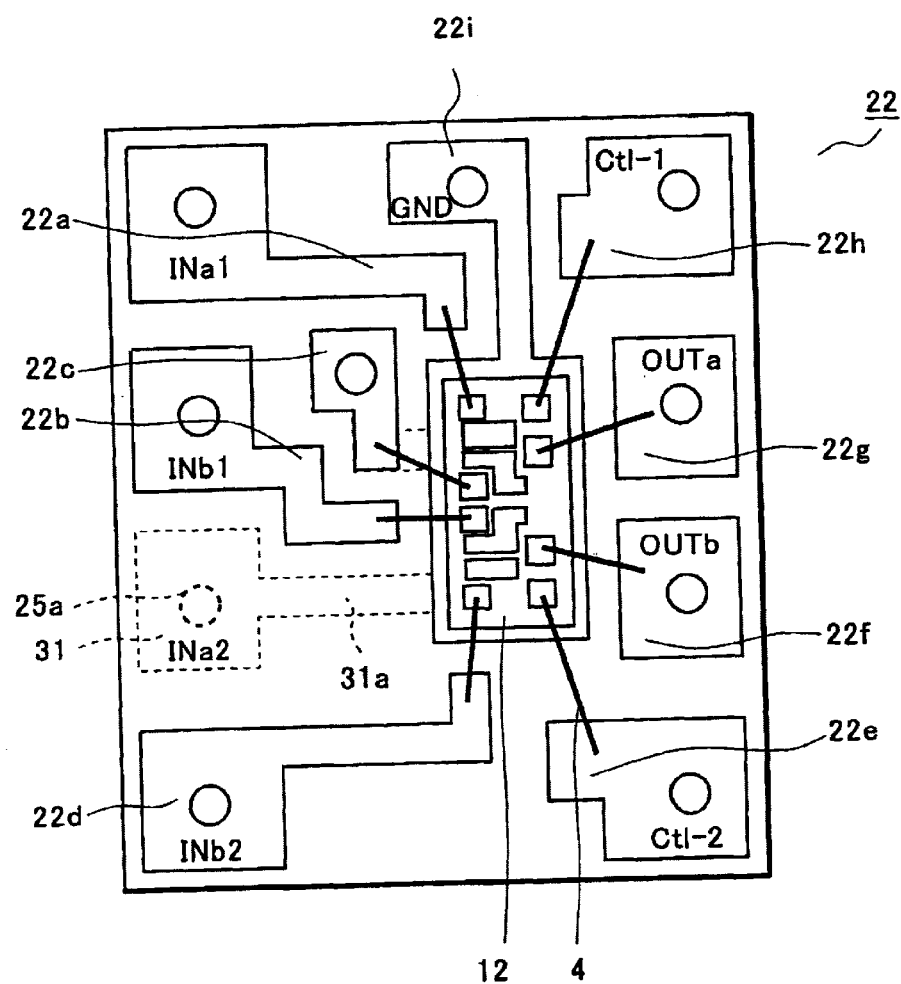
FIG. 11 is a plan view of the semiconductor chip of FIG. 7 mounted on the wiring board of FIG. 10.

FIG. 11 is a plan view of the wiring board of the second embodiment on which the compound semiconductor chip of FIG. 7 used in the first embodiment is mounted. All the leads of the second layer lead pattern 22 and the corresponding electrode pads of the chip 12 are connected by the bonding wires 4 in the same manner as in the first embodiment. The lead 22i extending from the ground terminal GND is, however, not connected to any of the electrode pad of the chip 12. This lead 22i is formed exclusively as an electromagnetic shield to prevent high frequency signal interference between the lead 31a located under the chip 12 and the circuit elements formed on the chip 12. For this reason, the lead 22i is always at a ground voltage (reference voltage) through a connection to an external ground source via the corresponding external electrode. As is the case with the first embodiment, the lead 22i does not have to cover the whole bottom side of the chip as long as it functions as a proper electromagnetic shield between the lead 31a underneath the chip 12 and the circuit elements of the chip 12. For example, the lead 22i may cover the bottom side of the chip only at portions corresponding to the lead 31a running under the chip, and may still be effective in preventing the high frequency signal interference. Because the lead 22i disposed between the chip 12 and the high frequency wiring (lead 31a) underneath the chip 12 is always at a ground voltage (reference voltage) during device operation, the shielding effect of the configuration of the second embodiment may be higher than the shielding effect of the configuration of the first embodiment. Accordingly, the semiconductor device of the second embodiment may have better isolation characteristics than those of the first embodiment.

Figure 12A:
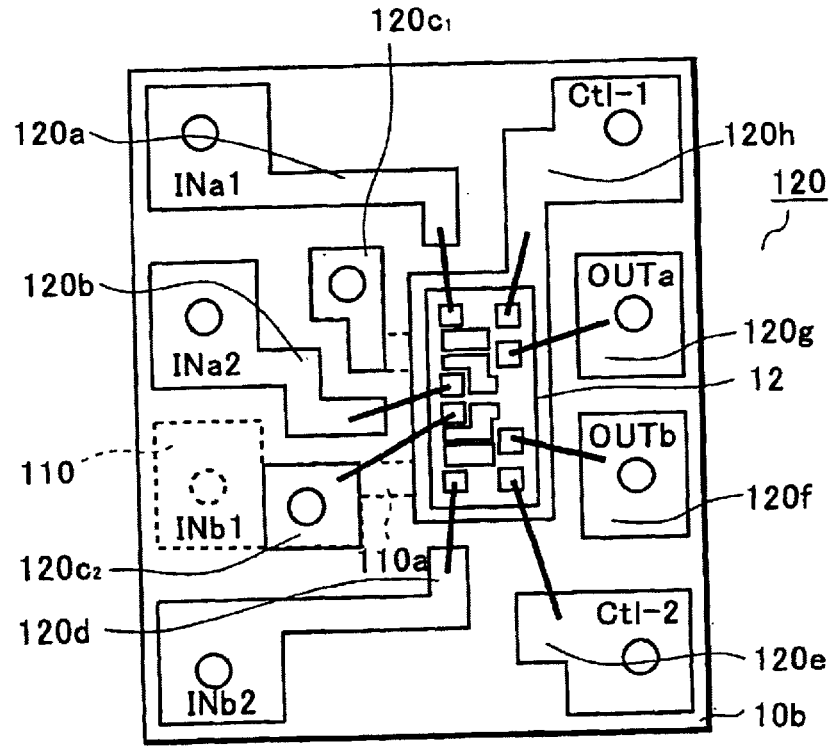
FIG. 12A is a plan view of the semiconductor chip of FIG. 7 mounted on a modified wiring board of the first embodiment with a wiring connection.
Figure 12B:
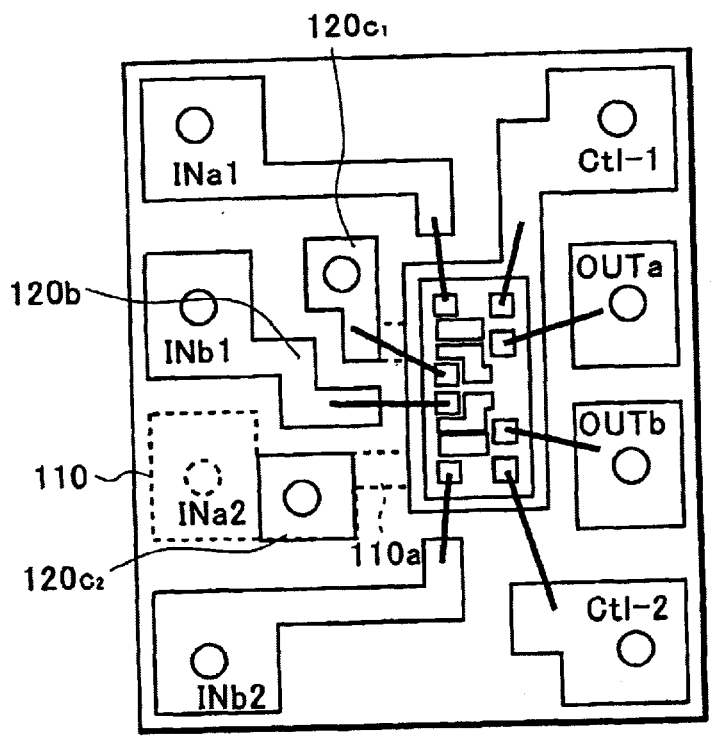
FIG. 12B is a plan view of the semiconductor chip of FIG. 7 mounted on the modified wiring board of the first embodiment with another wiring connection.

FIGS. 12A and 12B show the packaging of the first embodiment with a modification to allow an alternative connection scheme. The configuration of the terminals INa1, INa2, INb1, INb,2, Ctl-2, OUTb, OUTa, Ctl-1, the corresponding leads 120a, 120b, 110a, 120d, 120e, 120f, 120g, 120h, 120c1 and the corresponding electrode pads of the chip is identical to the configuration of FIG. 8A. The difference is that an additional lead 120c2 is formed as a part of the second layer lead pattern 120 on the insulating layer and is connected to the lead 110a of the first layer lead pattern 110, which is indicated by the dotted lines in the figures. The lead 120c1 and 120c2, both of which are connected to the lead 110a, are disposed opposite to each other with respect to the lead 120b, which is located in the U-shaped pocket of the lead 110a. Additionally, the portion of the lead 110a of the first layer lead pattern 110 underneath the additional lead 120c2 is enlarged to provide space large enough to allow a formation of a through hole that connects the two leads 120c2, 110a.

Based on this configuration of the first and second layer lead patterns 110, 120, the packaging of this modified first embodiment can have two different wiring connections by changing the wire bonding connections between the two leads 110a, 120b in the middle of the terminal array on the left side of the wiring board and the two input electrode pads in the middle of the pad array on the left side of the chip.

Figure 1:
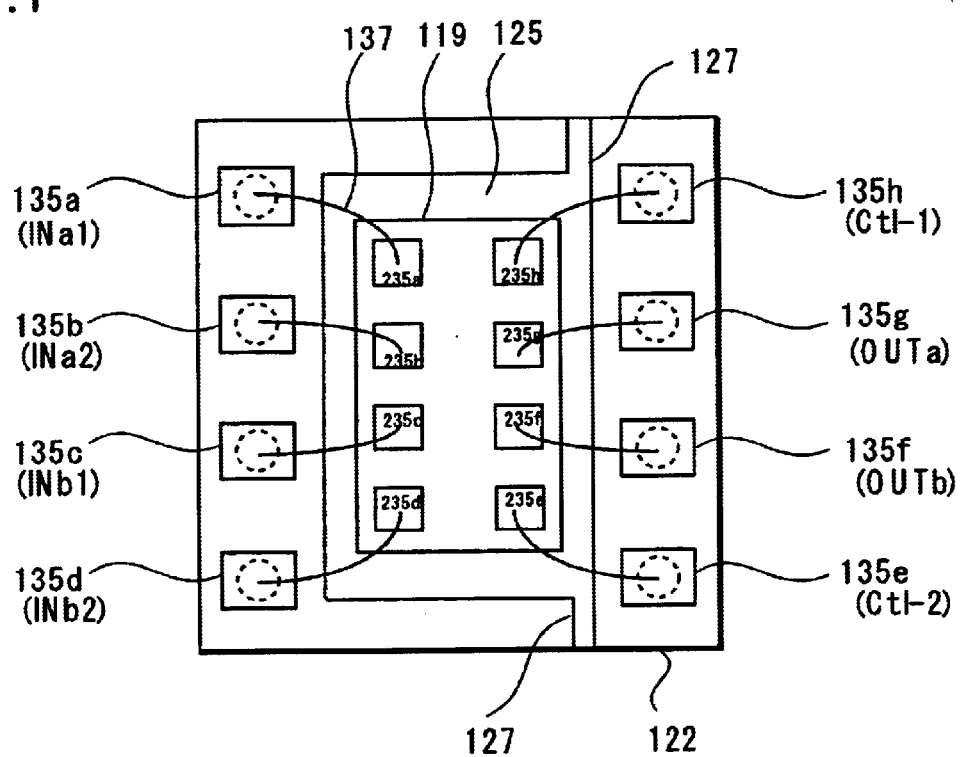
FIG. 1 is a plan view of a two-switch chip with eight electrode pads mounted on a substrate with eight terminals.

In the connection scheme shown in FIG. 12A, the lead 120b is connected to the input electrode pad Ia2, and the lead 110a is connected to the input electrode pad Ib1 using the lead 120c2. Accordingly, this connection is the same as the connection of FIG. 1. In other words, the intersecting wiring of FIG. 8A is not formed within the packaging structure. There may be other applications of this semiconductor device in which intersecting wiring is not required. The device of this modified first embodiment can be easily adjusted for use in such applications by adopting this wiring configuration. On the other hand, the intersecting wiring of FIG. 8A can be also formed by connecting the lead 120b to the Ib1 and connecting the lead 110a to the electrode pad Ia2 using the lead 120c1, as shown in FIG. 12B.

By changing the wiring connection, the terminal connected to the lead 120b can be a terminal representing the input electrode pad Ia2 or a terminal representing the input electrode pad Ib1. Likewise, the terminal connected to the lead 110a can also represent the input electrode pad Ia2 or the input electrode pad Ib1. This alternative connection scheme is also applied to the second embodiment.

Figure 13:
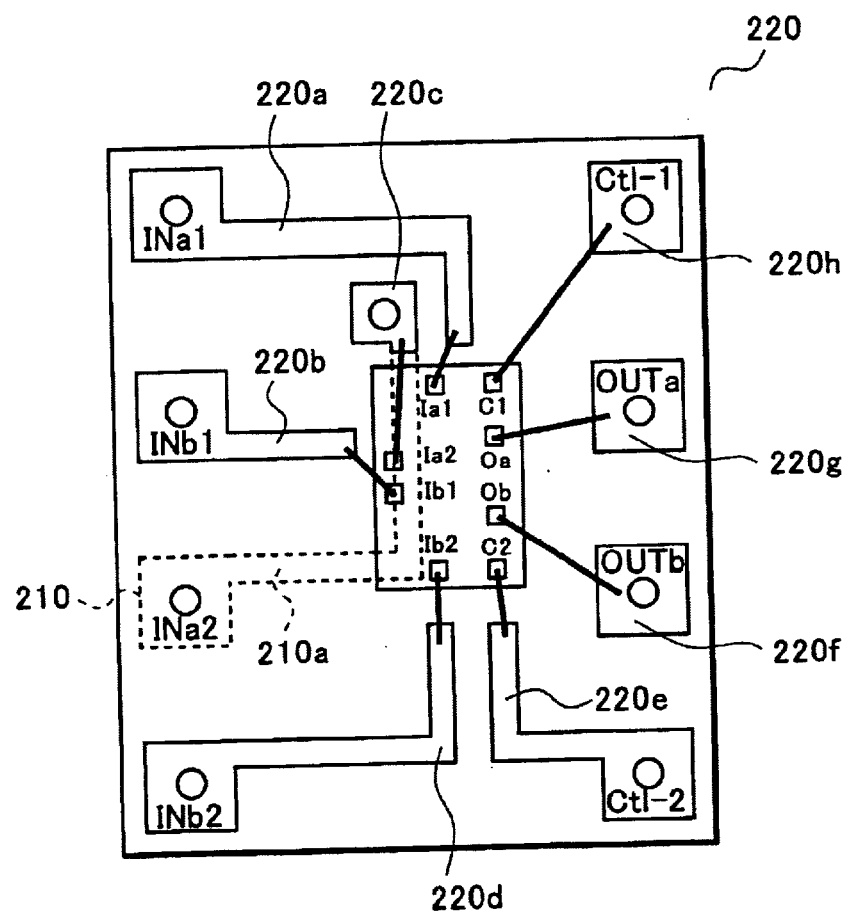
FIG. 13 is a plan view of the semiconductor chip of FIG. 7 mounted on another modified wiring board of the first embodiment.

FIG. 13 is a plan view of the packaging of the first embodiment with an alternative lead configuration. This lead configuration is the same as the lead configuration of FIG. 8A of the first embodiment except the shape of the lead 210a of the first layer lead pattern 210 and the positioning of the corresponding lead 220c of the second layer lead pattern 220. The lead 210a runs underneath the mounting area of the lead 220h extending from the control terminal Ctl-1 and comes out of the mounting area at the top side of the mounting area. Accordingly, the lead 220c that is connected to the lead 210a is located near the top side of the wiring board. Although the lead 220c is not located on the same side of the wiring board as the lead 220b, the lead 220c is still on the opposite side of terminal INa2 with respect to the lead 220b and can provide the intersecting wiring for the electrode pads Ia2, Ib1 and the corresponding terminals INa2, INb1. The configuration of the other terminals INa1, INb2, Ctl-2, OUTb, OUTa, Ctl-1, the corresponding leads 220a, 220d, 220e, 220f, 220g, 220h and the corresponding electrode pads Ia1, Ib2, C2, Ob, Oa, C1 is identical to that of the FIG. 8A. One exception is that the two electrode pads Ia2, Ib1 in the middle of the pad array on the left side of the chip are shifted toward the edge of the chip. This modification may be applicable to the second embodiment. Furthermore, an additional lead connected to the lead 210a may be provided on the insulating layer so that the alternative wiring connections shown in FIGS. 12A and 12B can be achieved.

It should noted that in the embodiments described above the boding wires are configured not to intersect each other to prevent signal interference between the intersecting bonding wires.

In the first and second embodiments, a switching device made of a compound semiconductor is mounted on the wiring board. However, other semiconductor chips, including other integrated circuits, transistors and diodes that are made of silicon or compound semiconductors, can be mounted on the wiring board in the packaging. Furthermore, passive elements, including chip capacitors, chip resistors and chip inductors, can be also mounted on the wiring board in order to change the relative positioning of terminals into a reversal of the positioning of the corresponding electrode pads of such elements. Elements that are mounted with the top surface facing the lead pattern can be also mounted on the wiring board. In other words, any surface mounted element can be used in the packaging of this invention.

The above is a detailed description of particular embodiments of the invention which is not intended to limit the invention to the embodiments described. It is recognized that modifications within the scope of the invention will occur to persons skilled in the art. Such modifications and equivalents of the invention are included within the scope of this invention.

What is claimed is:

1. A wiring board for mounting a surface mounted element thereon, comprising:
   an insulating substrate;
   a first terminal disposed on the substrate;
   a first lead disposed on the substrate and extending from the first terminal;
   an insulating layer disposed on the first terminal, the first lead and the substrate;
   a second terminal disposed on the insulating layer;
   a second lead disposed on the insulating layer and extending from the second terminal;
   a third terminal disposed on the insulating layer;
   a third lead disposed on the insulating layer and extending from the third terminal, a portion of the third lead being configured to have the surface mounted element mounted thereon; and
   a fourth lead disposed on the insulating layer, the first terminal and the fourth lead being disposed opposite to each other with respect to the second lead,
   wherein the first and second terminals are disposed on a same side of the wiring board with respect to the mounting portion of the third lead, and
   the first lead runs underneath the mounting portion of the third lead and is connected to the fourth lead.

2. The wiring board of claim 1, further comprising a fifth lead disposed on the insulating layer and is connected to the first lead, the fourth and fifth leads being disposed opposite to each other with respect to the second lead.

3. The wiring board of claim 1, wherein the first terminal and the fourth lead are disposed on the same side of the wiring board with respect to the mounting portion of the third lead.

4. A packaging of a surface mounted element, comprising:
   an insulating substrate;
   a first terminal disposed on the substrate;
   a first lead disposed on the substrate and extending from the first terminal;
   an insulating layer disposed on the first terminal, the first lead and the substrate;
   a second terminal disposed on the insulating layer;
   a second lead disposed on the insulating layer and extending from the second terminal;
   a third terminal disposed on the insulating layer;
   a third lead disposed on the insulating layer and extending from the third terminal, the surface mounted element being mounted on a portion of the third lead; and
   a fourth lead disposed on the insulating layer, the first terminal and the fourth lead being disposed opposite to each other with respect to the second lead,
   wherein the first and second terminals are disposed on a same side of the substrate with respect to the surface mounted element, and the first lead runs underneath the mounting portion of the third lead and is connected to the fourth lead.

5. The packaging of a surface mounted element of claim 4, wherein the first terminal and the fourth lead are disposed on the same side of the substrate with respect to the surface mounting element.

6. The packaging of a surface mounted element of claim 4, further comprising a fifth lead disposed on the insulating layer and is connected to the first lead, the fourth and fifth leads being disposed opposite to each other with respect to the second lead.

7. The packaging of a surface mounted element of claim 6, wherein an electrode pad on the surface mounted element that corresponds to the first terminal is connected to the fourth lead or the fifth lead so that an output portion of a device external to the packaging that is configured to connect with the first terminal is positioned closer to the first terminal than other output portions of the external device.

8. The packaging of a surface mounted element of claim 7, wherein the electrode pad on the surface mounted element is connected to the fourth lead or the fifth lead by a bonding wire.

9. A semiconductor device comprising:
an insulating substrate;
a first terminal disposed on the substrate;
a first lead disposed on the substrate and extending from the first terminal;
an insulating layer disposed on the first terminal, the first lead and the substrate;
a second terminal disposed on the insulating layer;
a second lead disposed on the insulating layer and extending from the second terminal;
a third terminal disposed on the insulating layer;
a third lead disposed on the insulating layer and extending from the third terminal;
a semiconductor chip mounted on a portion of the third lead and having a plurality of electrode pads formed on a surface thereof; and
a fourth lead disposed on the insulating layer, the first terminal and the fourth lead being disposed opposite to each other with respect to the second lead, wherein the first and second terminals are disposed on a same side of the substrate with respect to the semiconductor chip, and the first lead runs underneath the mounting portion of the third lead and is connected to the fourth lead.

10. The semiconductor device of claim 9, wherein the third terminal is connected to a DC voltage.

11. The semiconductor device of claim 9, wherein the third terminal is not connected to any of the electrode pads of the semiconductor chip.

12. The semiconductor device of claim 9, wherein the semiconductor chip comprises a compound semiconductor chip having a bottom portion that is semi-insulating and faces the third lead.

13. The semiconductor device of claim 9, wherein the semiconductor chip comprises a switching device that has two switching circuits.

14. The semiconductor device of claim 9, wherein the second lead and fourth leads are connected to two of the electrode pads of the semiconductor chip so that relative positioning of the first and second terminals is a reversal of relative positioning of the two electrode pads connected to the respective terminals through the respective leads.

15. The semiconductor device of claim 9, wherein the first terminal and the fourth lead are disposed on the same side of the substrate with respect to the semiconductor chip.

16. The semiconductor device of claim 9, further comprising a fifth lead disposed on the insulating layer and is connected to the first lead, the fourth and fifth leads being disposed opposite to each other with respect to the second lead.

17. The semiconductor device of claim 16, wherein one of the electrode pads of the semiconductor chip is connected to the fourth lead or the fifth lead so that an output portion of a device external to the semiconductor device that is configured to connect with the first terminal is positioned closer to the first terminal than other output portions of the external device.

* * * * *